United States Patent [19]

Hanrahan et al.

[11] Patent Number: 5,904,978
[45] Date of Patent: May 18, 1999

[54] ELECTRICALLY CONDUCTIVE POLYTETRAFLUOROETHYLENE ARTICLE

[75] Inventors: James R. Hanrahan; Michael P. Kienzle, both of Newark, Del.; Mark S. Spencer, Phoenix, Ariz.

[73] Assignee: W. L. Gore & Associates, Inc., Newark, Del.

[21] Appl. No.: 08/573,339

[22] Filed: Dec. 15, 1995

[51] Int. Cl.$^6$ ........................................................ B32B 5/18
[52] U.S. Cl. .................................. 428/313.5; 428/317.9; 428/319.3; 428/322.7; 428/324; 428/325; 428/329; 428/330; 200/511; 174/110 S; 174/110 F; 174/110 FC
[58] Field of Search ............................ 428/283, 313.5, 428/317.9, 319.3, 322.7, 324, 325, 329, 330; 174/110, 110 S, 110 F, 110 FC; 200/511

[56] References Cited

U.S. PATENT DOCUMENTS

| | | | |
|---|---|---|---|
| 2,893,105 | 7/1959 | Lauterbach | 28/72.2 |
| 4,291,775 | 9/1981 | Collins | 177/1 |
| 4,557,957 | 12/1985 | Manniso | 428/36 |
| 4,615,933 | 10/1986 | Traut | 428/252 |
| 4,720,400 | 1/1988 | Manniso | 427/243 |
| 4,840,838 | 6/1989 | Wyss | 428/234 |
| 4,857,668 | 8/1989 | Buonanno | 174/35 GC |
| 4,888,234 | 12/1989 | Smith et al. | 428/234 |
| 4,931,479 | 6/1990 | Morgan | 521/76 |
| 5,028,739 | 7/1991 | Keyser et al. | 174/35 GC |
| 5,045,635 | 9/1991 | Kaplo et al. | 174/35 GC |
| 5,105,056 | 4/1992 | Hoge, Jr. et al. | 174/35 GC |
| 5,115,104 | 5/1992 | Bunyan | 174/35 GC |
| 5,130,024 | 7/1992 | Fujimoto et al. | 210/500.36 |
| 5,202,536 | 4/1993 | Buonanno | 174/35 GC |
| 5,209,967 | 5/1993 | Wright et al. | 428/283 |
| 5,286,568 | 2/1994 | Bacino et al. | 428/422 |
| 5,294,270 | 3/1994 | Fenical | 148/576 |
| 5,401,901 | 3/1995 | Gerry et al. | 174/35 MS |
| 5,429,869 | 7/1995 | McGregor et al. | 428/364 |
| 5,431,571 | 7/1995 | Hanrahan et al. | 428/308.4 |
| 5,519,172 | 5/1996 | Spencer et al. | 174/110 |
| 5,738,936 | 4/1998 | Hanrahan | 428/313.5 |

FOREIGN PATENT DOCUMENTS

| | | |
|---|---|---|
| 1053932 | 8/1991 | China . |
| 0 302 596 | 8/1989 | European Pat. Off. . |
| 61-174700 | 8/1986 | Japan . |
| 1724739 | 11/1989 | U.S.S.R. . |

*Primary Examiner*—William Krynski
*Assistant Examiner*—Cathy F. Lam
*Attorney, Agent, or Firm*—Victor M. Genco, Jr.

[57] ABSTRACT

An electrically conductive composite article is provided having a polytetrafluoroethylene fibril matrix and a predetermined volume. The electrically conductive composite article comprises electrically conductive particles, and electrically nonconductive, energy expanded hollow polymeric particles. The volume percent of the electrically conductive particles is at least 20 volume percent. The electrically conductive composite article is continuously electrically conductive throughout its entire structure. Accordingly, electric current freely flows through the composite article due to the low resistivity of the article. The electrically conductive composite article may additionally include an elastomer material disposed within the article in a discontinuous fashion.

9 Claims, 5 Drawing Sheets

ELECTRICALLY CONDUCTIVE POLYTETRAFLUOROETHYLENE ARTICLE

FIELD OF THE INVENTION

The present invention generally relates to an improved, electrically conductive polytetrafluoroethylene article.

BACKGROUND OF THE INVENTION

Electromagnetic interference (EMI) has been defined as undesired conducted or radiated electrical disturbances from an electrical or electronic apparatus, including transients, which can interfere with the operation of other electrical or electronic apparatus. Such disturbances can occur anywhere in the electromagnetic spectrum. Radio frequency interference (RFI) is often used interchangeably with electromagnetic interference, although it is more properly restricted to the radio frequency portion of the electromagnetic spectrum, usually defined as between 10 kilohertz (kHz) and 100 gigahertz (GHz).

A shield is defined as a metallic or otherwise electrically conductive configuration inserted between a source of EMI/RFI and a desired area of protection. Such a shield may be provided to prevent electromagnetic energy from radiating from a source. Additionally, such a shield may prevent external electromagnetic energy from entering the shielded system. As a practical matter, such shields normally take the form of an electrically conductive housing which is electrically grounded. The energy of the EMI/RFI is thereby dissipated harmlessly to ground.

Necessarily, most housings for electrical equipment are provided with access panels, hatches, doors and/or removable covers. Gaps which form between the panels, hatches, doors and/or removable covers provide an undesired opportunity for electromagnetic energy to leak into the shielded system. The gaps also interfere with electrical current running along the surfaces of a housing. For example, if a gap is encountered, the impedance of the gap is such that electromagnetic energy may radiate from an opposed side of the gap, much like a slot antenna.

Various configurations of gaskets have been developed over the years to close the gaps of such shields and to effect the least possible disturbance of the ground conduction currents. Each seeks to establish as continuous an electrically conductive path as possible across the gap(s). However, there are inevitable compromises between: the ability of the gasket to smoothly and thoroughly engage and conform to the surface of the housing adjacent the gaps; the conductive capacity of the gasket; the ease of mounting the gasket; and the cost of manufacturing and installing the gasket.

Presently, many electronic devices, such as but not limited to pocket pagers, cellular phones, laptop computers and wireless local area networks (LANs) are constructed using metallized plastic injection molded housings which are not manufactured to exact tolerances. Therefore, gaps form about the seams of an individual housing. Typically, in such devices mating housing members incorporate a snap-together method of closure, or in other instances, a limited number of light gauge screws are utilized to provide housing closure. Accordingly, most electronic devices having metallized plastic injected molded housings do not require substantial closure force to assemble a respective housing. Any shielded gasket which is incorporated into such electronic devices must be deformable under a low compression force.

Conventionally, conductive particle filled silicone elastomers have been utilized as conductive gaskets to reduce EMI and RFI. However, such materials tend to be relatively hard (e.g. Shore A hardness of about 60 or greater). Because of their hardness, conductive particle filled silicone elastomers are not well suited for use as a gasket in a device having a housing which is assembled with a substantially low closure force. Additionally, conductive particle filled silicone elastomers are difficult to manipulate when die cut into a thin gasket.

Other EMI/RFI shielding gaskets have been proposed which incorporate a conductive fabric or mesh which surrounds a soft, conformable foam material. Examples of such gaskets are disclosed in U.S. Pat. Nos. 5,028,739; 5,115,104; 4,857,668; 5,045,635; 5,105,056; 5,202,536; and 5,294,270. Although the gaskets disclosed in the foregoing U.S. patents may be deformable under a low compression force, these gaskets do not have continuous conductivity throughout the material. Therefore, these gasket materials cannot be die cut into arbitrary shapes to function as an EMI/RFI gasket.

Seemingly, what the prior art lacks is an improved electrically conductive material which is deformable under a low compressive load, and which is conformable and continuously conductive throughout the structure of the material such that the material is operable, in one application, to provide EMI shielding, in a frequency range from about 10 MHz to about 20 GHz, when used as a gasket between conductive seams.

SUMMARY OF THE INVENTION

The present invention relates to an electrically conductive composite article obtained from a predetermined precursor material. The electrically conductive composite article has a polytetrafluoroethylene matrix and comprises electrically conductive particles, and electrically nonconductive, energy expanded hollow polymeric particles. In one embodiment of the present invention, the volume percent of the electrically conductive particles is at least 20 volume percent of the precursor material. The electrically conductive composite article is continuously electrically conductive in an uncompressed state. Accordingly, electric current freely flows through the composite article due to the low resistivity of the article.

The volume percent of the electrically nonconductive, energy expanded hollow polymeric particles may be in a range from about 3 to about 15 volume percent of the precursor material. The electrically conductive particles may be selected from a group consisting essentially of: metal powder, metal bead, metal fiber, metal coated fiber, metal flake, metal coated metals, metal coated ceramics, metal coated glass bubbles, metal coated glass beads, and metal coated mica flakes.

The electrically conductive composite article may include an elastomer material disposed within the composite article in a discontinuous fashion. Suitable elastomer materials include but are not limited to: silicone elastomers, fluorosilicone elastomers, fluorocarbon elastomers, perfluoro elastomers, other fluoroelastomer materials, or polyurethane.

It is, therefore, a purpose of the present invention to provide an improved, easily compressible, continuously electrically conductive polytetrafluoroethylene article for use in a variety of applications requiring a flexible, conformable, and continuously electrically conductive material throughout the structure of the article.

It is also a purpose of the present invention to provide an improved electrically conductive material for use as an EMI shielding gasket.

It is another purpose of the present invention to provide an improved, continuously electrically conductive polytetrafluoroethylene material having a Shore A hardness of less than about 30.

BRIEF DESCRIPTION OF THE DRAWINGS

The foregoing summary, as well as the following detailed description of a preferred embodiment of the invention, will be better understood when read in conjunction with the appended drawings. For purposes of illustrating the invention, there is shown in the drawings an embodiment which is presently preferred. It should be understood, however, that the invention is not limited to the precise arrangement and instrumentality shown. In the drawings.

DETAILED DESCRIPTION OF THE INVENTION

Figure 1:
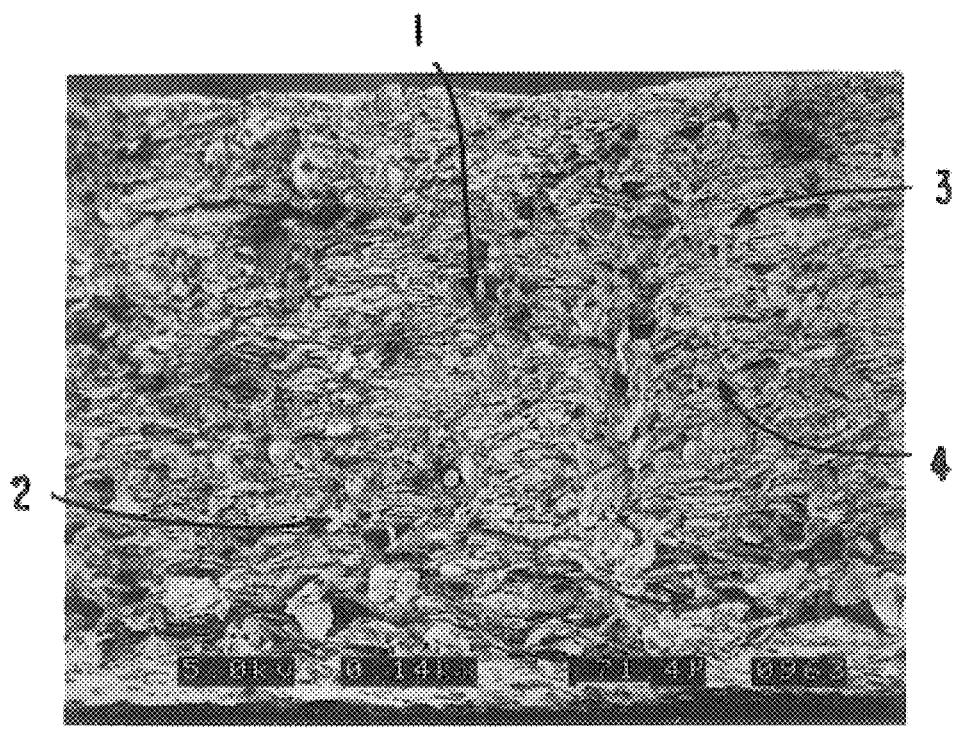
FIG. 1 is a photomicrograph of one unexpanded embodiment of the present invention shown at 0.14k magnification.

In the present invention, an electrically conductive polytetrafluoroethylene (PTFE) article is provided comprising energy expandable particulate blended into a PTFE and conductive metal composition. The polytetrafluoroethylene article of the present invention is permanently, continuously electrically conductive throughout its entire structure, (i.e. electric current will freely flow through the polytetrafluoroethylene article of the present invention due to the low resistivity of the article). Such a material may be effectively employed in a variety of useful applications, including but not limited to, an electrically conductive grounding and shielding material, battery and fuel cell applications, as a catalytic material, as a flow through electrode in electrolyte systems, instrumentation applications, electrofiltration applications, microwave applications, antenna systems or strip lines, for example. As the term is used herein, "electrically conductive" shall mean a volume resistivity of less than about $10^4$ Ω•cm, and preferably less than about $10^3$ Ω•cm.

The expandable particulate useful in the present invention exhibits intumescence upon application of heat. The expandable particulate is not homogeneous, i.e. it is not a polymeric bead, but rather comprises a polymeric shell having a central core comprised of a fluid material. A further characteristic is that the overall dimensions of the expandable particulate increase upon heating at a specific temperature.

Expandable hollow polymeric particulate useful in a precursor composite material of the present invention includes those materials comprised of a polymeric shell and a core of at least one other material, either liquid or gaseous, most preferably a liquid at room temperature, in which the polymeric shell is essentially insoluble. A liquid core is advantageous because the degree of expansion is directly related to the volume change of the core material at the expansion temperature. For a gaseous core material, the volume expansion expected can be approximated from the general gas laws. However, expandable particulate comprising a liquid core material offers the opportunity to provide much larger volume changes, especially in those cases where a phase change takes place (i.e., the liquid volatilizes at or near the expansion temperature).

Preferred expandable polymeric particulate (also called microspheres, microballoons, and microbubbles) useful in the precursor composite can have shells comprising copolymers such as vinyl chloride and vinylidene chloride, copolymers of vinyl chloride and acrylonitrile, copolymers of vinylidene chloride and acrylonitrile, copolymers of methacrylonitrile and acrylonitrile, and copolymers of styrene and acrylonitrile. Further can be mentioned are copolymers of methyl methacrylate containing up to about 2 percent by weight of styrene, copolymers of methyl methacrylate and up to about 50 percent by weight of ethyl methacrylate, and copolymers of methyl methacrylate and up to about 70 percent by weight of orthochlorostyrene. The unexpanded microspheres contain fluid, preferably volatile liquid, i.e., a blowing agent, which is conventional for microspheres of the type described here. Suitably, the blowing agent is 5 to 30 percent by weight of the microsphere. The microspheres can be added in different manners, as dried particles, wet cakes, or in a suspension, e.g. in an alcohol such as isopropanol.

Unexpanded particulate desirably is in the size range of from about 0.1 micrometer to about 600 micrometers, preferably from 0.5 micrometer to 200 micrometers, and most preferably from 1 micrometer to 100 micrometers. Expanded particulate can have a size in the range of from about 0.12 micrometer to 1000 micrometers, preferably from 1 micrometer to 600 micrometers. After expansion, the volume of the expandable particulate increases by a factor of at least 1.5, preferably by a factor of at least 5, and most preferably by a factor of at least 10, and may even be as high as a factor of about 100.

Suitable microspheres are commercially available from Nobel Industries of Sundsvall, Sweden, under the trademark EXPANCEL®. These microspheres may be obtained in a variety of sizes and forms, with expansion temperatures generally ranging from 80 to 130° C. A typical EXPANCEL microsphere has an initial average diameter of 9 to 17 micrometers and an average expanded diameter of 40 to 60 micrometers. According to Nobel Industries, the microspheres have an unexpanded true density of 1250–1300 kg/m$^3$, and an expanded density below 20 kg/m$^3$.

It should be understood that the use of the term "energy expandable particulate" herein is intended to encompass any hollow resilient container filled with volatile fluid which is adapted to expand. Although presently available microspheres are essentially ball-shaped particles adapted to expand when exposed to an energy source, it should be understood that such microspheres are quite resilient in their expanded form and can be compressed and released (e.g. through extrusion) to achieve the expansion required for the present invention. Additionally, it may be possible to form such products in a variety of other shapes, such as tubes, ellipsoids, cubes, particles, etc. As such, the term "energy expandable particulate" in the context of the present invention is intended to include all applicable forms and uses of these products now known or later developed.

A wide variety of blowing or raising agents may be enclosed within the polymeric shell of the expandable microspheres. They can be volatile fluid-forming agents such as aliphatic hydrocarbons including ethane, ethylene, propane, butane, isobutane, isopentane, neopentane, acetylene, hexane, heptane, or mixtures of one or more such aliphatic hydrocarbons, preferably having a number average molecular weight of at least 26, and a boiling point at atmospheric pressure about the same temperature range or below the range of the softening point of the resinous material of the polymeric shell when saturated with the particular blowing agent utilized.

In one presently preferred embodiment of the present invention, EXPANCEL type 091 DU microspheres are employed. This product comprises an off-white dry powder with a particle size ranging between 10 and 40 micrometers. The shell of these microspheres comprise acrylonitrile. The volatile liquid comprises isopentane.

It has been found that by mixing a dry preparation of EXPANCEL microspheres with a dispersion of PTFE, or similar polymer, and then heating the resulting composition, the polymer will undergo expansion in three-dimensions to achieve a fibrillated PTFE matrix.

In accordance with the present invention, a precursor material comprised of: electrically conductive particulate; PTFE, in the form of paste, dispersion or powder; and microspheres, in the form of a dry powder or solution, is mixed in proportions of at least 20 to 90 volume percent conductive particulate, 3 to 15 volume percent EXPANCEL microspheres, and 5 to 70 volume percent PTFE, with proportions of 60 volume percent conductive particulate, 6 volume percent EXPANCEL microspheres and 34 volume percent PTFE being preferred in an embodiment comprising at least in part electrically conductive flakes. Mixture may occur by any suitable means, including dry blending of powders, wet blending, co-coagulation of aqueous dispersions and slurry filler, high shear mixing, etc. As the term is used herein, "volume percent" shall mean a percentage of the volume of the precursor material.

Electrically conductive particulate enmeshed within the resulting PTFE precursor material is the major component thereof. The electrically conductive particulate may include, but is not limited to, metal powder, metal bead, metal fiber, or metal flake, or it can be a metal coated particulate such as metal coated metals, metal coated ceramics, metal coated glass bubbles, metal coated glass beads, or metal coated mica flakes. Preferred conductive metals in particulate form include, but are not limited to, silver, nickel, aluminum, copper, stainless steel, graphite, carbon, gold, or platinum, for example. Preferred metal coatings include silver, nickel, copper, or gold. Additionally, a combination of two or more conductive particulates can be used. Average size of the conductive flakes can be from about 1 $\mu$m to about 200 $\mu$m, preferably from about 1 $\mu$m to about 100 $\mu$m, and most preferably from about 20 $\mu$m to about 40 $\mu$m. Average size for conductive powders can be from about 0.5 $\mu$m to about 200 $\mu$m, preferably from about 0.5 $\mu$m to about 100 $\mu$, and most preferably from about 2 $\mu$m to about 60 $\mu$m.

The PTFE aqueous dispersion employed in producing the PTFE precursor of the present invention may be a milky-white aqueous suspension of PTFE particles. Typically, the PTFE aqueous dispersion will contain about 20% to about 70% by weight solids, the major portion of such solids being PTFE particles having a particle size in the range of from 0.05 micrometers to about 5.0 micrometers. Such PTFE aqueous dispersions are presently commercially available from the E. I. duPont de Nemours Company, for example, under the tradename TEFLON® 3636, which is 18–24% by weight solids being for the most part PTFE particles of about 0.05 micrometers to about 5.0 micrometers.

A thickness of the above described precursor material may range from about 5 mils to about 125 mils, for example.

Upon heating the precursor material, thickness increases due to the expansion of the energy expandable particulate. The amount of expansion observed is dependent on several factors, including the weight percent of energy expandable particulate present, the type of energy expandable particulate, the molecular weight of the polymeric shell of the energy expandable particulate, and the toughness of the PTFE matrix holding the precursor material together. Typical thickness of the material of the invention can be in the range of from about at least 10 mils, and preferably from 10 to 100 mils, and most preferably from 20 to 60 mils. Other thicknesses can be achieved.

Temperatures needed for the thermal expansion step to occur are dependent on the type of polymer comprising the shell of the microsphere and on the particular blowing agent used. Typical temperatures range from about 40° C. to about 220° C., preferably from 60° C. to 200° C., most preferably from 80° C. to 190° C.

In addition to the composite article which has been described above, an alternate embodiment of the present invention may be made by adding an elastomer material, such as a silicone elastomer material (e.g. dimethyl siloxane) to the precursor material. In one embodiment of the present invention, this is achieved by compounding the filled fine powder coagulum with the dimethyl siloxane. A suitable dimethyl siloxane is Sylgard® type 1-4105, or Q1-4010, which may be obtained from Dow Corning. [It may also be suitable to use a silicone dioxide reinforced silicone material such as Q3-661 which may also be obtained from Dow Corning.] The siloxane is added on a weight per weight basis, and may be diluted with a solvent, such as mineral spirits, for example. In general, the siloxane may be added in amounts ranging from 1 to about 50 percent, preferably from 5 to about 20 percent, and most preferably from 10 to about 15 percent. Other suitable elastomer materials include but are not limited to: silicone rubbers, fluorosilicone elastomers, fluorocarbon elastomers, perfluoro elastomers, other fluoroelastomer materials, or polyureathane.

Subsequently, this precursor material is heated in a range from about 130° C. to about 190° C., to not only achieve expansion of the precursor material, but also to catalyze the siloxane into a cured state. The resulting article is an easily compressible, continuously electrically conductive PTFE composite, including a silicone elastomer disposed within the composite article in a discontinuous fashion.

The addition of the elastomer material yields a composite with increased z-strength, tensile strength and elongation. It also provides some degree of resilience and increases the usable temperature range of the material. These desired properties are achieved without sacrificing electrical conductivity or softness/compressibility of the composite article.

The following procedures were used to determine the properties of the materials created in the following examples.

Percent Compression

The expanded samples were measured for percent compression at 200 psi per ASTM F36-88.

Volume Resistivity

The volume resistivity was measured with round silver probes, one square inch in area. In order to achieve a measurement for uncompressed volume resistivity, a one pound weight was put on the probes to yield the resistance of the sample at one psi. Heavier weights were employed to measure resistance of the composite article of the present invention at various compression levels. The conversion from resistance to volume resistivity is as follows:

$$\vartheta = \frac{RA}{L}(\Omega \cdot cm)$$

Density

The density of the precursor material was obtained by using a 1"×6" template to cut a sample exactly 1"×6". The sample was then weighed to the nearest 0.01 grams and the density calculated as follows:

D(g/cc)=M/V; where M=Mass of sample to nearest 0.01 grams

V=Volume (Length×width×thickness)

Additionally, the expanded composite material was also measured in the manner described. The term % expansion will denote the % change in density of the sample in accordance with the following:

$$\% \text{ Expansion} = \frac{\text{initial} - \text{final}}{\text{initial}} \times 100$$

Shielding Effectiveness

Shielding effectiveness was calculated by the following method:

Shielding Effectiveness=20 log (τ); where
τ=Transmission Coefficient magnitude; and
τ=Vout/Vin
Vout=Voltage at the output
Vin=Voltage at the input The transmission coefficient was measured using a Hewlett-Packard type 8752A network analyzer. The test fixture used was based on a test fixture described in test method ARP-1705, however, the test fixture used was modified to work with the network analyzer. More particularly, since the transmission coefficient was directly measured by the network analyzer, a reference resistor was not used in conjunction with the fixture. Also, in order to yield the shielding effectiveness of the gasket under test without any contribution due to the fixture, the physical dimensions of the fixture were optimized for maximum transmissivity when no gasket was in place, and a normalization procedure was used to further remove the effect of the fixture.

Without intending to limit the scope of the present invention, the apparatus and method of production of the present invention may be better understood by referring to the following examples:

EXAMPLE 1

In a 1500 cc vessel, 72.4 g of silver flake, 14.7 g of 20% silver coated aluminum powder (from Novamet Specialty Products Corporation) and 2.0 g of EXPANCEL 091 DU type microspheres were slurried with 785 g de-ionized water and 87.3 g isopropyl alcohol. The mixture was stirred at 500 rpm. This mixture was co-coagulated with 38.25 g of a PTFE dispersion at 26.5% solids (type TE-3636 from E. I. duPont de Nemours and Company). The resulting coagulum was dried at 105° C. for 24 hours. The coagulum was then frozen at −10° C. for 6 hours, and then screened into powder form through a ¼" metal screen. The material was then lubricated with mineral spirits at a level of 0.125 pounds per pound. The material was then re-frozen for 24 hours, and hand screened through the ¼" metal screen to remove any large lumps of lubed coagulum. The resulting material was then allowed to dwell at room temperature for at least 4 hours. The lubed powder was then extruded into a tape form with a rectangular cross section, and calendered to a typical thickness of 25 mils. The tape was dried at 105° C. for five minutes and the following properties were measured:

1. Volume Resistivity (1 psi)=0.030 Ω·cm
2. Thickness=25 mils
3. Density=2.72 g/cc This same material was heated to 190° C. for five minutes to expand the composite and the following properties were measured:

1. Volume Resistivity (1 psi)=0.015 Ω·cm
2. Thickness=32 mils
3. Density=2.13 g/cc
4. % comp. at 200 psi=18%

Even though the composite expanded in size, hence becoming less dense, the conductivity became greater. This is a surprising result because the actual volume percent of the conductive material is less, but the conductivity of the composite is greater than the unexpanded, more dense material.

EXAMPLE 2

58.3 g of silver flake (Type 135 from Technic Inc.), 25.7 g of silver coated copper powder (from Novamet Specialty Products Corporation), and 2.0 g of EXPANCEL 091 DU type microspheres were slurried in isopropyl alcohol and de-ionized water, and then co-coagulated with 69.7 g of a PTFE dispersion at 20.1% solids (type TE-3636 from E. I. duPont de Nemours and Company). The resulting coagulum was processed, as described in Example 1, into a tape 22 mils thick, and dried at 105° C. for five minutes. The following properties were measured:

1. Volume Resistivity (1 psi)=0.031 Ω·cm
2. Thickness=22 mils
3. Density=3.29 g/cc This material was then heated to 190° C. for five minutes to expand the structure and the following properties were measured:

1. Volume Resistivity (1 psi)=0.016 Ω·cm
2. Thickness=31 mils
3. Density=2.08 g/cc
4. % comp. at 200 psi=22.3%

From the foregoing, it can be seen that not only is the material conductive throughout the structure after expansion, but the conductivity increased two-fold, even though the structure is 36.7% less dense. Such results are contradictory in light of conventional percolation theory.

EXAMPLE 3

108.8 g of silver flake (Type 135 from Technic Inc.), 46.6 g of silver coated copper powder (from Novamet Specialty Products Corporation), and 7.0 g of EXPANCEL 091 DU type microspheres were slurried with isopropyl alcohol and de-ionized water, and then co-coagulated with 176.4 g of PTFE dispersion at 20.8% solids (type TE-3636 E. I. duPont de Nemours and Company). The resulting coagulum was processed, as described in Example 1, into a tape 21 mils thick. The composite was dried at 105° C. for five minutes, and the following properties were measured:

1. Volume Resistivity (1 psi)=0.037 Ω·cm
2. Thickness=21 mils
3. Density=3.0 g/cc The material was heated to 190° for five minutes, and the following properties were measured:

1. Volume Resistivity (1 psi)=0.137 Ω·cm
2. Density=1.25 g/cc
3. Thickness=37 mils
4. % comp at 200 psi=35.3%

EXAMPLE 4

Figure 3:
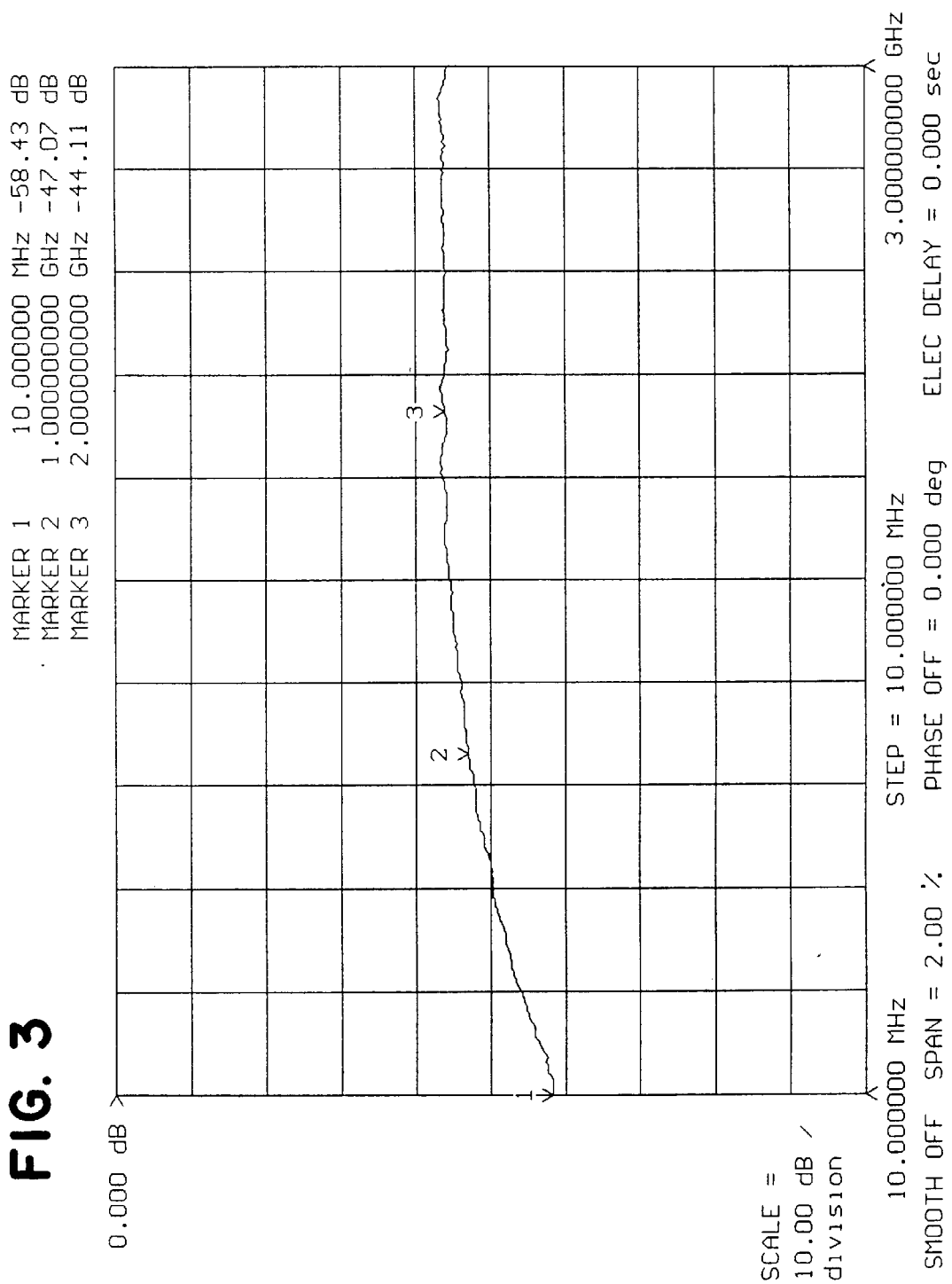
FIG. 3 is a graph of dB v. MHz depicting the results of electrical shielding testing for a carbon filled expanded polytetrafluoroethylene gasket material.

2164 g of silver flake (Type 135 from Technic Inc.), 431 g of 20% silver coated aluminum powder (from Novamet Specialty Products Corporation), and 36 g of EXPANCEL 091 DU microspheres were slurried with 10.6 liters of isopropyl alcohol and 11.2 liters of de-ionized water. The slurry was then co-coagulated with 1370 g of PTFE dispersion at 26.9% solids (type TE-3636 from E. I. duPont de Nemours and Company). The resulting coagulum was dried at 105° C. for 22 hours. The coagulum was then frozen at −10° C. for 6 hours, and screened into a powder form through a ¼ mesh metal screen. The material was then lubricated with mineral spirits at a level of 0.175 pounds per pound. The material was then re-frozen for 24 hours, hand screened through the ¼ metal screen to remove any large lumps of lubed coagulum. The resulting powder was then preformed into a 4" diameter pellet, and extruded into a tape 50 mils thick and 6" wide. The extrudate was calendered to about 20 mils and dried at 105° C. for 5 minutes. The following properties were measured:

1. Volume Resistivity (1 psi)=0.069 Ω•cm
2. Density=2.70 g/cc
3. Thickness=22 mils The resulting tape was then heated to 190° C. for a dwell time of 2 minutes. The following properties were measured:

1. Volume Resistivity (1 psi)=0.089 Ω•cm
2. Density=1.32 g/cc
3. Thickness=40 mils
4. % comp. at 200 psi=41%
5. Shore A Hardness=29
6. Resistivity at 50 psi=0.007 Ω•cm As can be seen from the foregoing, the material of Example 4 is conductive throughout the structure in a "no load" condition, i.e. 1 psi or less. This material becomes extremely conductive, i.e. 0.007 Ω•cm at relatively low loads (50 psi). To further demonstrate this effect, transfer impedance tests were taken over a frequency range of from 10 MHz to 3 GHz. In this regard, FIG. 3 depicts the results of such a test for a known carbon filled expanded PTFE material, having an initial thickness of 40 mils, which was compressed to 10 mils while being tested. The following results were measured:

| Shielding Effectiveness (dB) | Frequency |
|---|---|
| 58.43 | 10 MHz |
| 47.07 | 1 GHz |
| 44.11 | 2 GHz |

Figure 4:
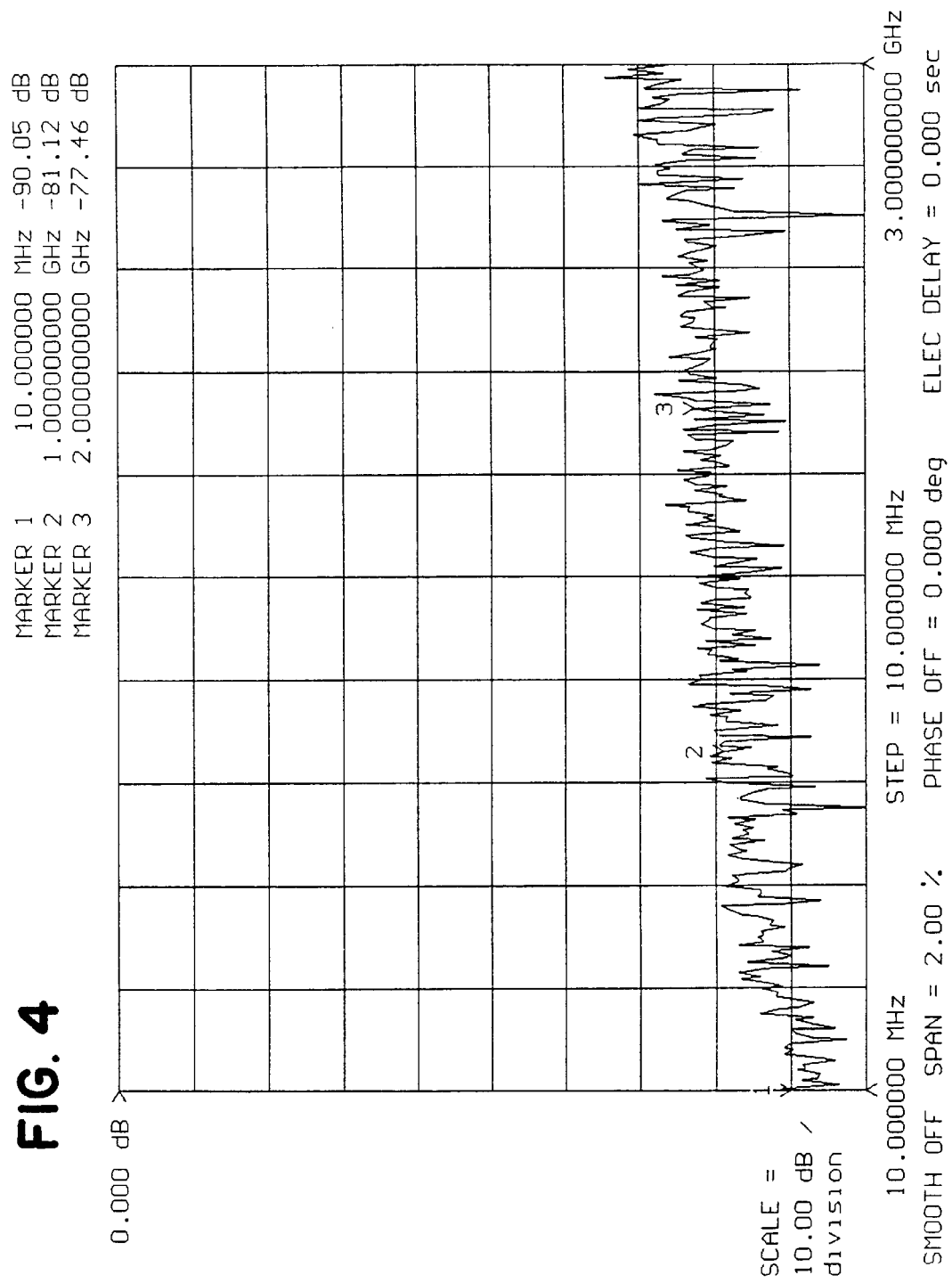
FIG. 4 is a graph of dB v. MHz depicting the results of electrical shielding testing for one embodiment of the electrically conductive polytetrafluoroethylene article of the present invention.

Additionally, the material produced in accordance with this Example 4, with a starting thickness of 40 mils, was similarly tested, and was also compressed to 10 mils during testing. FIG. 4 depicts the results of such a test. The following results were measured:

| Shielding Effectiveness (dB) | Frequency |
|---|---|
| 90.05 | 10 MHz |
| 81.12 | 1 GHz |
| 77.46 | 2 GHz |

FIG. 1 is a micrograph of a cross-section of the unexpanded tape, at a magnification of 0.14k, of this Example 4. As may be seen therein, it is evident that the EXPANCEL 091 DU microspheres 1 and the 20% silver coated aluminum powder 2 are randomly distributed through the structure. The silver flake 3 dominates the composite (due to its high loading of 40 volume percent), and appears in a layered from, sometimes separated by the silver coated aluminum powder 2 and/or the microspheres 1. The PTFE 4 is also randomly distributed, and is present throughout the structure attached to all fillers present.

Figure 2:
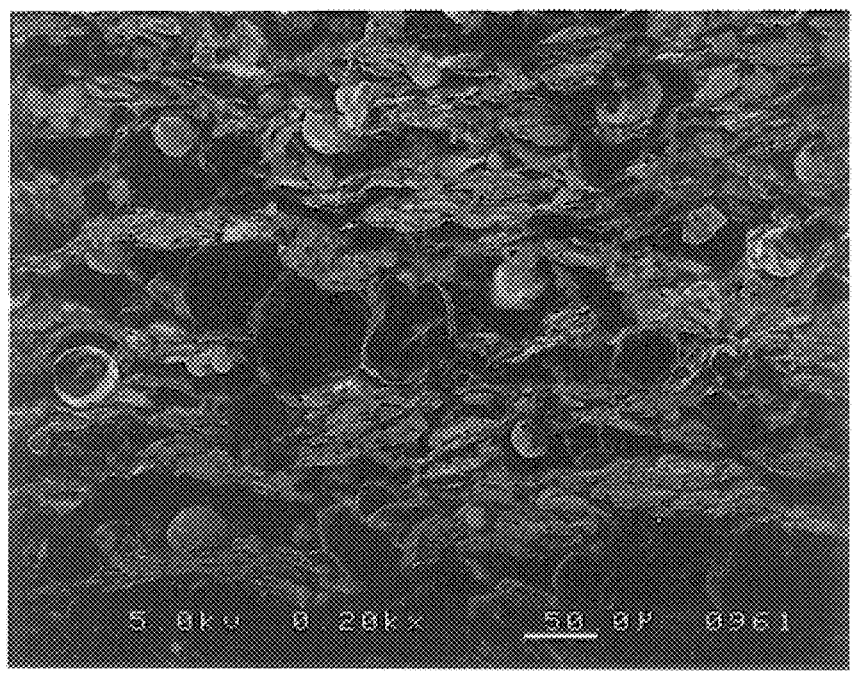
FIG. 2 is a photomicrograph of an expanded embodiment of the material of FIG. 1 shown at 0.20k magnification.

FIG. 2 is a micrograph of the expanded tape cross-section at a magnification of 0.20k. As may be seen therein, there is a presence of voids both inside the microspheres and throughout the structure. Additionally, the microspheres remain randomly distributed, but are much more prominent due to their increased size. The 20% silver coated aluminum powder remains randomly distributed, but the silver flakes are not disposed in a layered fashion. The silver flakes have been "pushed" and segmented in their distribution.

EXAMPLE 5

2023 g of silver flake (Type 450 from Technic Inc.), 404 g of 20% silver coated aluminum powder (from Novamet Specialty Products Corporation), and 39 g of EXPANCEL 091 DU microspheres were slurried with 10.3 liters of de-ionized water and 9.7 liters of isopropyl alcohol. The slurry was then co-coagulated with 2858 g of a PTFE dispersion at 18.7% solids (type TE-3636 from E. I. duPont de Nemours and Company). The resulting coagulum was dried at 95° C. for 16.5 hours. The coagulum was frozen at −10° C. for 7 hours, and hand screened into a powder form through a ¼" mesh metal screen. The material was then lubricated at a level of 0.2 pounds per pound with a lubricant comprising a mixture of 75% silicone monomer (Sylgard® type 4105 obtained from Dow Corning Inc.) and 25% mineral spirits. The material was then re-frozen at −10° C. for 17 hours, and re-screened through the ¼ screen. The resulting powder was then preformed into a 2.5" diameter pellet and extruded into a tape 45 mils thick and 4" wide. The extrudate was calendered to a thickness of about 20 mils, and dried at 105° C. for 5 minutes. The following properties were measured:

1. Thickness=22 mils
2. Volume Resistivity (1 psi)=0.069 Ω•cm
3. Density=2.91 g/cc After determining the extrudate properties, a gasket material was made by heating the tape, with the lubricant not removed, to a temperature of 190° C. for 2 minutes. The following properties were measured:

1. Thickness=61 mils
2. Volume Resistivity (1 psi)=0.083 Ω•cm
3. Volume Resistivity (50 psi)=0.007 Ω•cm
4. Density=0.96 g/cc (67% expansion)
5. % Comp. at 200 psi=56.9%

6. Shore A Hardness=22

In this example, the heating not only has the effect of expanding the structure of the tape, but additionally, the heating will cure the siloxane to create a network of silicone elastomer and expanded PTFE along with the conductive particles. This creates a material with a higher Z strength, a higher tensile strength, higher usable temperature range and better recoverability as compared to the material of Example 4, without degrading the EMI shielding effectiveness of the material.

Figure 5:
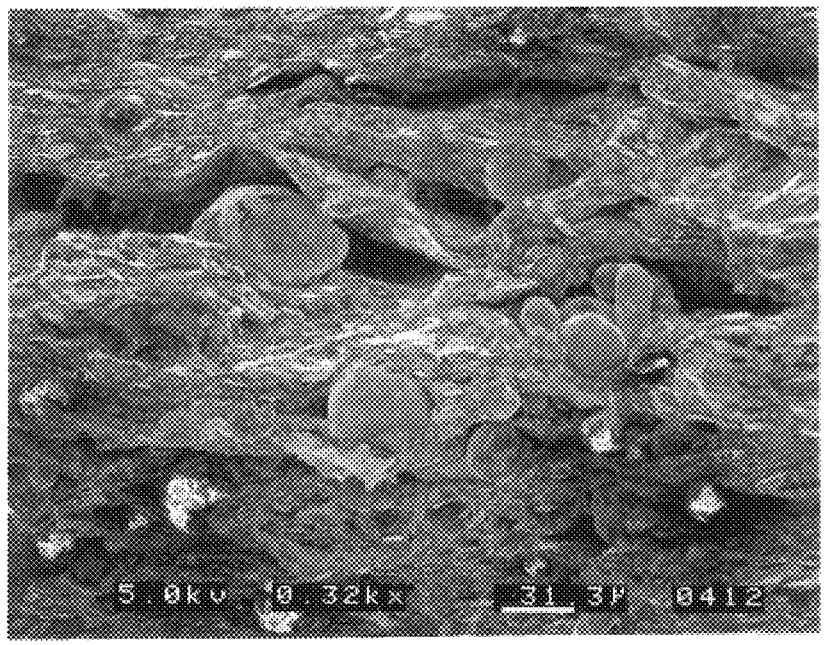
FIG. 5 is a photomicrograph of one unexpanded embodiment of the present invention shown at 0.32k magnification.

FIG. 5 is a photomicrograph of the unexpanded material of Example 5 shown at 0.32k magnification. This micrograph shows the random distribution of the microspheres and silver coated aluminum powder. FIG. 5 also shows the composite material which is dominated by the silver flake as in FIG. 1.

However, the material of Example 5 comprises the siloxane throughout the structure, coating all surfaces.

Figure 6:
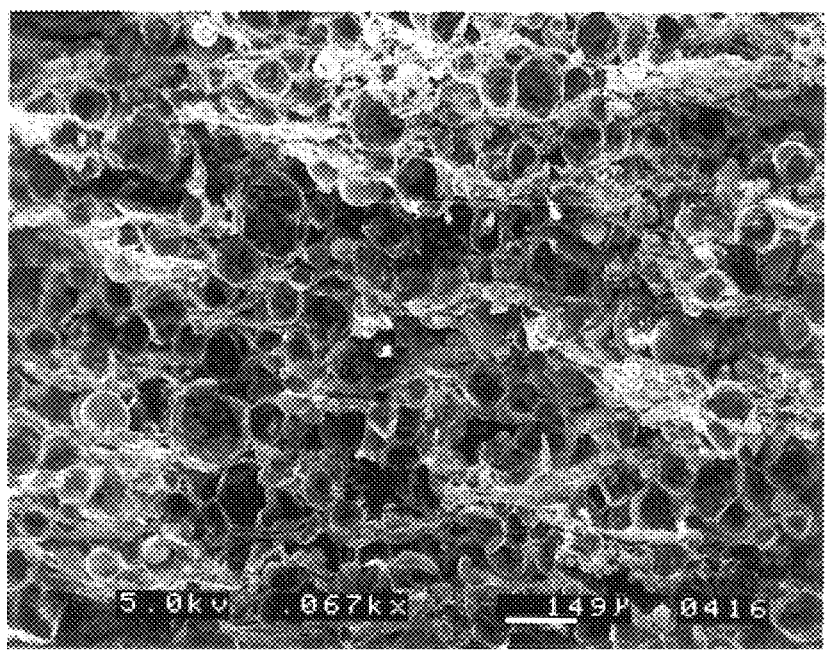
FIG. 6 is a photomicrograph of an expanded embodiment of the material of FIG. 5 shown at 0.067k magnification.

FIG. 6 is a photomicrograph of an expanded embodiment of the material of FIG. 5 shown at 0.067k magnification. As seen therein, the particles are distributed differently as described hereinabove. However, the silicone elastomer is clearly visible, as compared with FIG. 5. As evident from FIG. 6, the silicone elastomer has bonded to predetermined surfaces within the composite. However, the silicone elastomer is no longer continuous throughout the structure. This is caused by the simultaneous expansion/curing process.

Shielding effectiveness of the material of Example 5 was tested in accordance with the procedures described hereinabove. The following results were measured:

| Shielding Effectiveness (dB) | Frequency |
| --- | --- |
| 80 | 10 MHz |
| 77 | 1 GHz |

The above outlined data demonstrates that the presence of the silicone elastomer within the structure does not dramatically decrease the shielding effectiveness of the material.

EXAMPLE 6

285 g of nickel powder (type 123 from INCO Specialty Powder Products), and 2.4 grams of EXPANCEL 091 DU microspheres were slurried in 1.64 liters of de-ionized water, and co-coagulated with 12.6 g of a PTFE dispersion at 18.4% solids (type TE-3636 from E. I. duPont de Nemours and Company). The material was then processed as in Example 5, but extruded into a tape approximately 2" wide and 40 mils thick. The tape was calendered to 20 mils, and dried (but not expanded). The following properties were measured:

1. Thickness=20 mils
2. Volume Resistivity (1 psi)=4,300 Ω•cm
3. Density=3.14 g/cc After determining the above outlined non-expanded properties, a separate piece of the tape (not dried) was heated to 150° C. for 2 minutes. This provides the expansion/curing for the composite tape. The following properties were then measured:

1. Thickness=30 mils
2. Density=2.0 g/cc
3. % Comp at 200 psi=23.3%
4. Volume Resistivity (1 psi)=719 Ω•cm
5. Volume Resistivity (50 psi)=0.60 Ω•cm Unexpectedly, the resistivity went down by 83.3% (i.e., became more conductive), but the density decreased 36.3% (i.e., less conductive particles were present per unit volume). This result also contrasts with conventional percolation theory.

Comparative shielding effectiveness data was measured for the material of Example 6:

| Shielding Effectiveness (dB) | Frequency |
| --- | --- |
| 85 | 10 MHz |
| 83 | 1 GHz |
| 82 | 2 GHz |
| 79 | 3 GHz |

Figure 7:
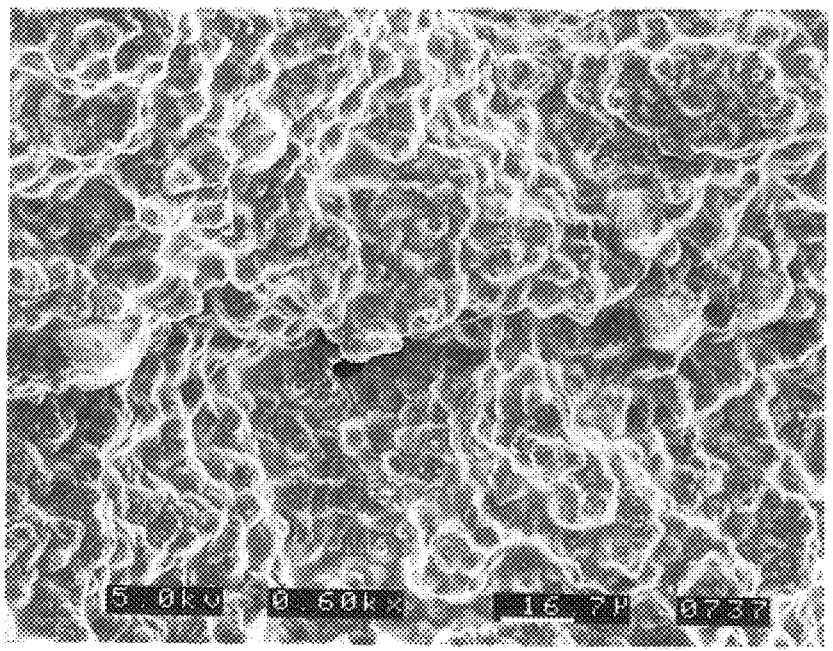
FIG. 7 is a photomicrograph of one unexpanded embodiment of the present invention shown at 0.60k magnification.

FIG. 7 is a photomicrograph of the unexpanded embodiment of the material of Example 6 shown at 0.60k magnification. In FIG. 7, it is apparent that the silicone elastomer is not only present throughout the structure, but dominates the micrograph so that it is difficult to see the PTFE or nickel. Therefore, the silicone elastomer coats the surfaces of the composite, which is in contrast to the material prepared in Example 5 and illustrated in FIG. 5.

Figure 8:
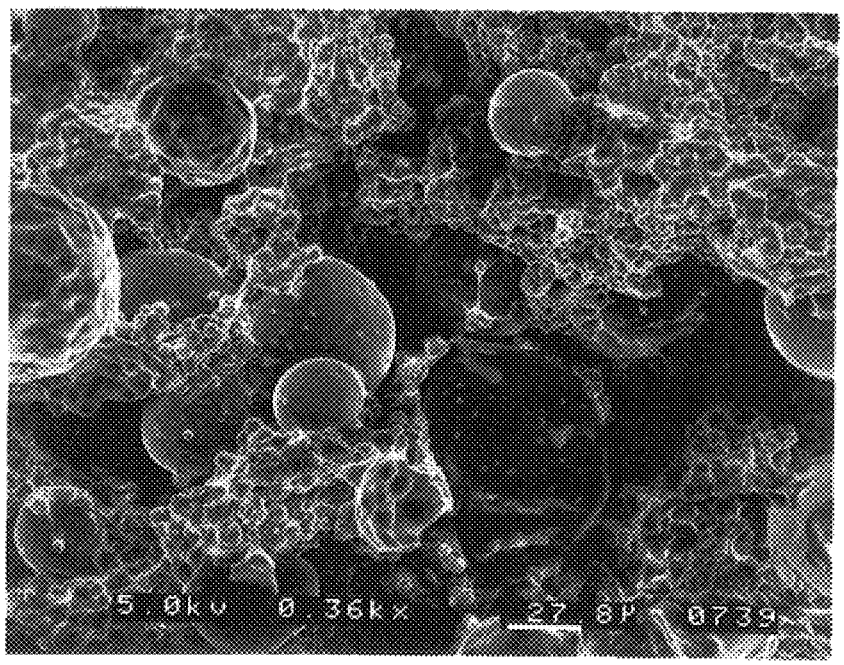
FIG. 8 is a photomicrograph of an expanded embodiment of the material of FIG. 7 shown at 0.3k magnification.

FIG. 8 is a photomicrograph of an expanded embodiment of the material of FIG. 7 shown at 0.36k magnification. As seen in FIG. 8, the existence of many voids, exposed nickel particles, and microspheres is evident. The silicone elastomer is present in a discontinuous fashion throughout the expanded material.

Although a few exemplary embodiments of the present invention have been described in detail above, those skilled in the art readily appreciate that many modifications are possible without materially departing from the novel teachings and advantages which are described herein. Accordingly, all such modifications are intended to be included within the scope of the present invention, as defined by the following claims.

Having described the invention, what is claimed is:

1. A continuously electrically conductive article comprising:

a polytetrafluoroethylene matrix having disposed therein electrically conductive particles; and electrically nonconductive resilient polymeric particles; and wherein the electrically conductive article is continuously electrically conductive, in an uncompressed state and has a volume resistivity of no greater than 1 Ω•cm.

2. The invention of claim 1, wherein the electrically conductive particles are selected from a group consisting of at least two of:

metal powder, metal bead, metal fiber, metal coated fiber, metal flake, metal coated metals, metal coated ceramics, metal coated glass bubbles, metal coated glass beads, and metal coated mica flakes.

3. The invention of claim 1 further including a silicone elastomer material.

4. A continuously electrically conductive composite article comprising:

a polytetrafluoroethylene matrix having disposed therein electrically conductive particles;

electrically nonconductive resilient polymeric particles; and an elastomer material disposed within the composite article; and wherein the electrically conductive composite article is continuously electrically conductive in an uncompressed state.

5. The invention of claim 4, wherein the electrically conductive particles are selected from a group consisting of at least two of:

metal powder, metal bead, metal fiber, metal coated fiber, metal flake, metal coated metals, metal coated ceramics, metal coated glass bubbles, metal coated glass beads, and metal coated mica flakes.

6. The invention of claim 4 having a density of less than 1.5 g/cc.

7. The invention of claim 4 having a Shore A hardness of less than 25.

8. The invention of claim 4 having a Shore A hardness of about 22.

9. The invention of claim 4 wherein the elastomer material is a silicone elastomer material.

* * * * *